United States Patent [19]
Oh et al.

[11] Patent Number: 6,046,474
[45] Date of Patent: Apr. 4, 2000

[54] FIELD EFFECT TRANSISTORS HAVING TAPERED GATE ELECTRODES FOR PROVIDING HIGH BREAKDOWN VOLTAGE CAPABILITY AND METHODS OF FORMING SAME

[75] Inventors: Hee-Seon Oh, Kyunggi-do; Seung-Joon Cha, Seoul, both of Rep. of Korea

[73] Assignee: Samsung Electronics Co., Ltd., Rep. of Korea

[21] Appl. No.: 09/079,089

[22] Filed: May 14, 1998

[30] Foreign Application Priority Data

May 15, 1997 [KR] Rep. of Korea .................. 97-18655

[51] Int. Cl.[7] .......................... H01L 31/119; H01L 29/76
[52] U.S. Cl. ..................... 257/343; 257/345; 257/389; 257/401; 438/291; 438/307; 438/300
[58] Field of Search ................... 257/339, 401, 257/343, 345, 336, 137, 264, 492, 172, 389; 438/299, 291, 307, 300

[56] References Cited

U.S. PATENT DOCUMENTS

| | | | |
|---|---|---|---|
| 4,587,713 | 5/1986 | Goodman et al. | 29/576 B |
| 5,264,719 | 11/1993 | Beasom | 257/335 |
| 5,444,279 | 8/1995 | Lee | 257/316 |
| 5,548,133 | 8/1996 | Kinzer | 257/155 |
| 5,917,217 | 6/1999 | Kitamura et al. | 257/343 |
| 5,932,897 | 8/1999 | Kawaguchi et al. | 257/141 |

*Primary Examiner*—Donald L. Monin, Jr.
*Attorney, Agent, or Firm*—Myers Bigel Sibley & Sajovec

[57] ABSTRACT

Field effect transistors having tapered gate electrodes include a body region of first conductivity type extending to a surface of a semiconductor substrate. Source and drain regions of second conductivity type are formed in the substrate and a gate electrode is formed on a portion of the surface extending opposite the body region and between the source and drain regions. A gate electrode insulating layer is also disposed between the gate electrode and the surface. To improve the transistor's withstand voltage capability by reducing field crowding, the gate electrode insulating layer is preferably formed to have a tapered thickness which increases in a direction from the source region to the drain region, and to reduce on-state resistance the drain region is formed in a self-aligned manner to the gate electrode.

13 Claims, 10 Drawing Sheets

FIELD EFFECT TRANSISTORS HAVING TAPERED GATE ELECTRODES FOR PROVIDING HIGH BREAKDOWN VOLTAGE CAPABILITY AND METHODS OF FORMING SAME

FIELD OF THE INVENTION

The present invention relates to semiconductor switching devices and methods of forming same, and more particularly to field effect transistors and methods of forming field effect transistors.

BACKGROUND OF THE INVENTION

Electric field crowding can play a significant role in limiting performance of semiconductor switching devices, particularly when such devices are used in high power applications and are required to withstand large blocking voltages. FIG. 1 illustrates a lateral field effect transistor having an N+ source region 14 formed within a P-type well region 8, an N+ drain 12 region formed in an N-type substrate 2, an insulated gate electrode 10 and a gate insulator 6. A field oxide isolation region 4 is also provided and contact is made to the P-type, well region by a P+ contact region 16 within the well region 8. As will be understood by those skilled in the art, electric field crowding in the region extending between the drain region 12 and the gate electrode 10 (region 18) may limit the withstand voltage of the transistor of FIG. 1.

FIG. 2 illustrates an attempt to modify the structure of the transistor of FIG. 1 to reduce field crowding problems. In particular, FIG. 2 illustrates a lateral field effect transistor having an N+ source region 32 formed within a P-type well region 26, an N+ drain region 28 formed in an N-type substrate 20, a gate insulator comprising portions of insulating region 24a and field oxide isolation region 22 and a gate electrode 30 formed on the gate insulator. Contact is made to the P-type well region 26 by a P+ contact region 34. The transistor of FIG. 2 has improved withstand voltage compared to the device of FIG. 1 because the drain region 28 is formed at remote location (at an opposite side of the field oxide isolation region 22 relative to the source 32), however, the active channel region 36 is relatively long which means the on-state resistance of the transistor of FIG. 2 may be relatively large and the on-state current drive capability may be relatively low.

Thus, notwithstanding attempts to form switching devices having high withstand voltage capability, there continues to be a need for improved switching devices which are less susceptible to field crowding, but still have favorable on-state characteristics.

SUMMARY OF THE INVENTION

It is therefore an object of the present invention to provide improved semiconductor switching devices and methods of forming same.

It is another object of the present invention to provide field effect transistors having high withstand voltage capability and methods of forming same.

It is still another object of the present invention to provide field effect transistors having high current drive capability and methods of forming same.

It is still a further object of the present invention to provide methods of forming field effect transistors having high withstand voltage capability, which are compatible with CMOS fabrication techniques.

These and other objects, advantages and features of the present invention are provided by improved semiconductor switching devices which include field effect transistors have reduced susceptibility to breakdown caused by field crowding. In particular, according to a first embodiment of the present invention, a preferred field effect transistor includes a body region of first conductivity type extending to a surface of a semiconductor substrate. Source and drain regions of second conductivity type are formed in the substrate and a gate electrode is formed on a portion of the surface extending opposite the body region and between the source and drain regions. A gate electrode insulating layer is also disposed between the gate electrode and the surface. To improve the transistor's withstand voltage capability by reducing field crowding, the gate electrode insulating layer is preferably formed to have a tapered thickness which increases in a direction from the source region to the drain region, and to reduce on-state resistance the drain region is formed in a self-aligned manner to the gate electrode.

The semiconductor substrate may also include a well region of first conductivity type extending to the surface and the body region may be disposed within the well region. The body region may also be compensated by second conductivity type dopants so that the body region has a lower net first conductivity type dopant concentration therein than the well region. According to one aspect of the present invention, the source region may be disposed within the body region and the drain region may be disposed outside the body region, but within the well region. According to another aspect of the present invention, the gate electrode also has a tapered thickness which increases in a direction from the drain region to the source region.

Preferred methods of forming semiconductor switching devices also include the steps of forming a semiconductor substrate having a surface thereon and forming a gate electrode insulating layer having a tapered thickness which increases from a first thickness at a first end to a second thickness at a second end, on the surface. Steps are also performed to form a gate electrode on the first and second ends of the gate electrode insulating layer and form source and drain regions of second conductivity type in the semiconductor substrate, adjacent and self-aligned to the first and second ends of the gate electrode, respectively. Here, the steps of forming a gate electrode and gate electrode insulating layer may comprise the steps of forming a first electrically insulating layer on the surface and forming a gate electrode having first and second ends, on the first electrically insulating layer. Steps may also be performed to increase a thickness of a portion of the first electrically insulating layer extending between the second end of the gate electrode and the surface by oxidizing a portion of the surface extending opposite the second end of the gate electrode. The gate electrode may also comprise polycrystalline silicon and the step of increasing a thickness of a portion of the first electrically insulating layer may comprise oxidizing a second end of the gate electrode so that the first end of the gate electrode is thicker than the second end of the gate electrode. The step of oxidizing a portion of the surface extending opposite the second end of the gate electrode may also comprise oxidizing a portion of the surface extending opposite the second end of the gate electrode to define a field oxide isolation region adjacent the second end of the gate electrode. The step of forming source and drain regions may also include the steps of etching the field oxide isolation region to define a drain contact opening therein which is self-aligned to the gate electrode and then implanting dopants of second conductivity type through the drain contact opening and into the surface to define a drain region in the semiconductor substrate.

DESCRIPTION OF PREFERRED EMBODIMENTS

Figure 1:
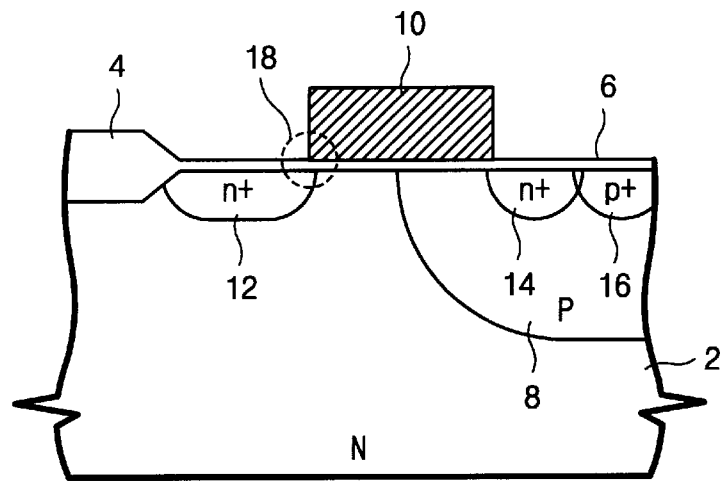
FIG. 1 is a cross-sectional view of a first field effect transistor according to the prior art.
Figure 2:
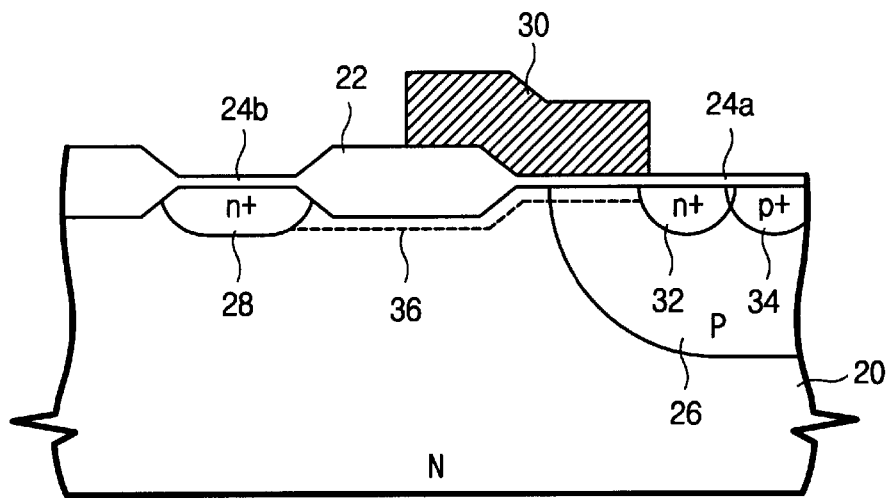
FIG. 2 is a cross-sectional view of a second field effect transistor according to the prior art.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types. Like numbers refer to like elements throughout.

Referring now to FIGS. 3 and 4A–4M, preferred methods of forming a semiconductor switching devices according to a first embodiment of the present invention will be described. These semiconductor switching devices may include NMOS, PMOS and DMOS-based field effect transistors having high withstand voltage capability. This high withstand voltage capability stems, in part, from the use of gate electrode insulating layers having non-uniform thicknesses, as described more fully hereinbelow. In particular, with respect to FIG. 4A, initial steps are performed to form a semiconductor substrate 100 having a first well region 102 of first conductivity type (shown as P-well) therein extending to a surface thereof and a second well region 104 of second conductivity type (shown as N-well) therein extending to the surface. Here, the substrate 100 may comprise a bulk semiconductor region or may be formed as an epitaxial layer on a bulk semiconductor region or electrically insulating region (e.g., SOI substrate). As illustrated, the first and second well regions 102 and 104 may be formed at adjacent locations within the substrate 100. As will be understood by those skilled in the art, the first and second well regions 102 and 104 may be formed by selectively implanting dopants of first and second conductivity type into the substrate 100 using respective implant masks, and then annealing the substrate to diffuse and drive-in the implanted dopants. Next, a first electrically insulating layer 106 of predetermined thickness is formed on the surface of the substrate 100. The first electrically insulating layer 106 may be formed of silicon dioxide, for example, and as described more fully hereinbelow, may comprise a portion of a gate electrode insulating layer. A gate conductive layer 108 is then formed on the first electrically insulating layer 106, opposite the surface of the substrate 100. The gate conductive layer 108 may be formed by depositing a doped or undoped blanket layer of polycrystalline silicon on the first electrically insulating layer 106.

Figure 4A:
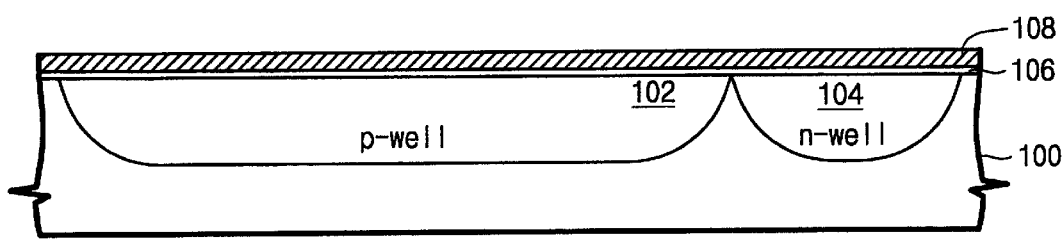
FIGS. 4A–4M are cross-sectional views of intermediate structures which illustrate preferred methods of forming the semiconductor switching devices of FIG. 3.
Figure 4B:
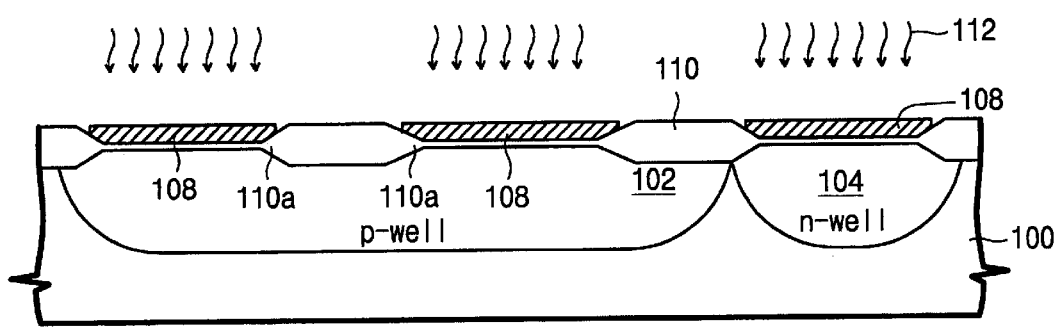

Referring now to FIG. 4B, the gate conductive layer 108 is then patterned using conventional photolithography techniques. In particular, a photolithographically defined nitride mask (not shown) may be applied to the gate conductive layer 108 and then an etching step may be performed to selectively etch portions of the gate conductive layer 108 and first electrically insulating layer 106 until respective underlying portions of the substrate 100 are exposed. These exposed portions of the substrate 100 will then be used to define inactive portions of the substrate 100. In particular, field oxide isolation regions 110 are formed at the exposed portions of the substrate 100 by thermally oxidizing the exposed portions of the substrate 100 using such conventional oxidation techniques such as LOCOS. Here, the photolithographically defined nitride mask (not shown) may also be used as an oxidation prevention mask to limit oxidation of the patterned gate conductive layer 108. However, as illustrated by FIG. 4B, bird's beak oxide extensions 110a may extend outward from the field oxide isolation regions 110 and merge with corresponding portions of the first electrically insulating layer 106. The patterned gate conductive layer 108 may then be doped by performing a blanket implant of dopants 112 of second conductivity type (e.g., N-type) into the patterned gate conductive layer 108, with the field oxide isolation regions 110 being used as an implant mask. Second conductivity type dopants may also be diffused into the patterned gate conductive layer 108 by exposing the patterned gate conductive layer 108 to a dopant containing gas (e.g., $POCl_3$).

Figure 4C:
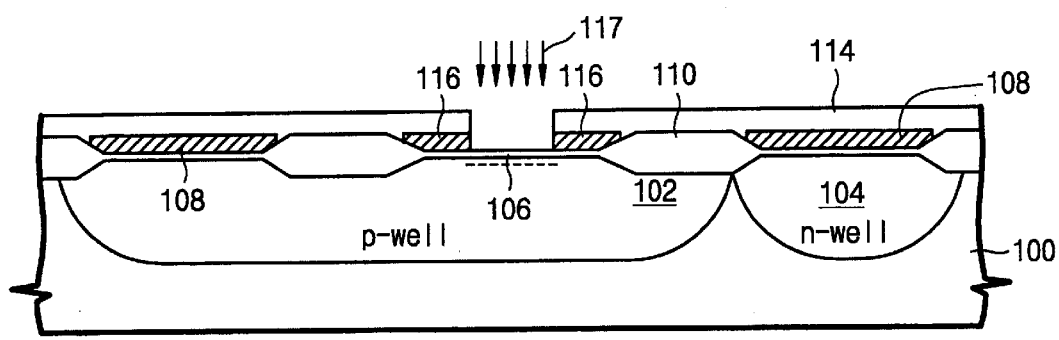
Figure 4D:
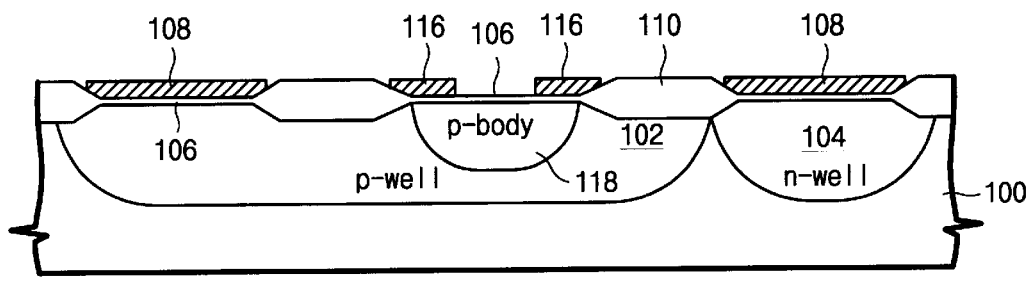

Referring now to FIG. 4C, a first layer of photoresist 114 is then deposited on the patterned gate conductive layer 108 and field oxide isolation regions 110. The layer of photoresist 114 is then photolithographically defined to expose a portion of the patterned gate conductive layer 108. An etching step is then performed to etch through the exposed portion of the patterned gate conductive layer 108 and expose an underlying portion of the first electrically insulating layer 106. As described more fully hereinbelow, this etching step also defines first and second gate electrodes 116 of a lateral DMOS field effect transistor to be formed. As illustrated in transverse cross-section, these first and second gate electrodes 116 may be formed as separate stripe-shaped regions which extend in a third dimension (not shown), however, these regions may also constitute opposing portions of a single gate electrode 116 having an annular shape when viewed in a direction normal to the surface. Nonetheless, for clarity with respect to the cross-sectional views of FIGS. 4A–4M, these first and second gate electrodes 116 will be treated herein and in the claims as separate gate electrodes.

Second conductivity type dopants 117 (e.g., N-type) may then be selectively implanted through the exposed portion of the first electrically insulating layer 106 and into the first well region 102 of first conductivity type (e.g., P-type), as illustrated. A heat treatment step (e.g., annealing step) may then be performed at a temperature of about 1100° C. (or greater) and for a duration of 30 minutes (or greater), to diffuse the implanted dopants 117 of second conductivity type into the first well region 102. These steps define a body region 118 of net first conductivity type (e.g., P–) within the first well region 102 (e.g., P) which has a higher net concentration of first conductivity type dopants therein. Here, the dopants 117 may be implanted to compensate a portion of the first well region 102 and thereby reduce the net concentration of first conductivity type dopants therein, but not fully convert the portion to second conductivity type. Here, the term "net" concentration refers to a difference in absolute concentration of the first and second conductivity type dopants.

Figure 4E:
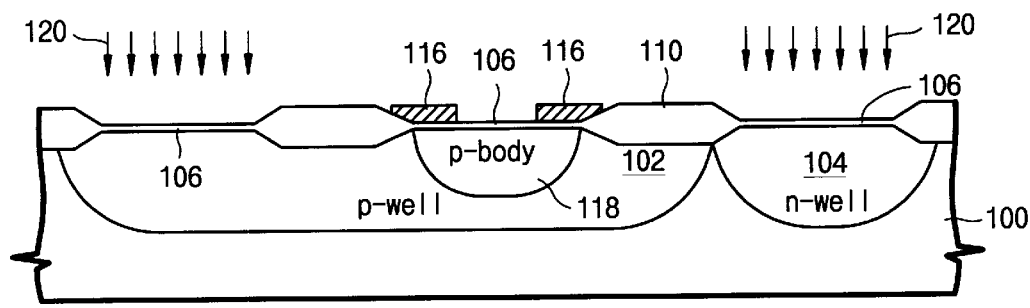
Figure 4F:
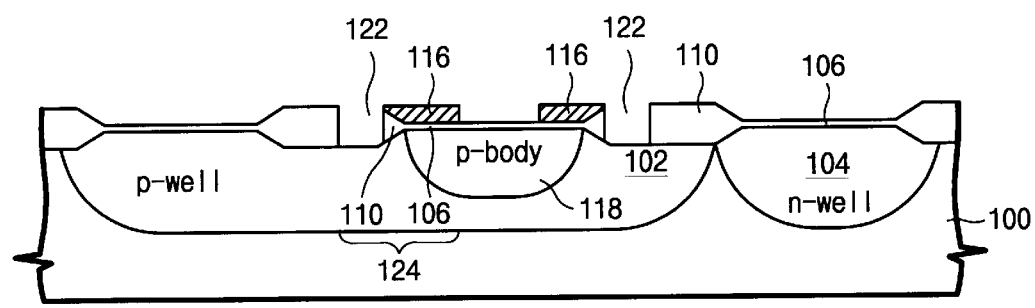

Referring now to FIG. 4E, portions of the patterned gate conductive layer 108 are then removed to expose additional portions of the first electrically insulating layer 106. Implant ions 120 are then selectively implanted into the first and second well regions 102 and 104 so that the threshold voltages of NMOS and PMOS transistors subsequently formed in these well regions 102 and 104 can be carefully controlled. As illustrated best by FIG. 4F, a selective etching step is then performed to define drain contact openings 122 in those field oxide isolation regions 110 which extend adjacent the first and second gate electrodes 116. These drain contact openings 122 preferably expose recessed portions of the surface of the substrate 100 which extend opposite the first well region 102. Here, the recession of the surface of the substrate 100 results from the consumption of silicon which takes place during thermal oxidation to form the field oxide isolation regions 110. The first and second gate electrodes 116 can also perform a masking function during etching of the field oxide isolation regions, so that the drain contact openings 122 are preferably self-aligned to ends of the first and second gate electrodes 116. This etching step also defines gate electrode insulating layers 124. These gate electrode insulating layers 124 have a tapered cross-sectional thickness which leads to an improved withstand voltage capability by limiting field crowding near the drain-end of a field effect transistor (e.g., DMOS transistor). As described more fully hereinbelow, this tapered thickness increases in a direction from source to drain.

Figure 4G:
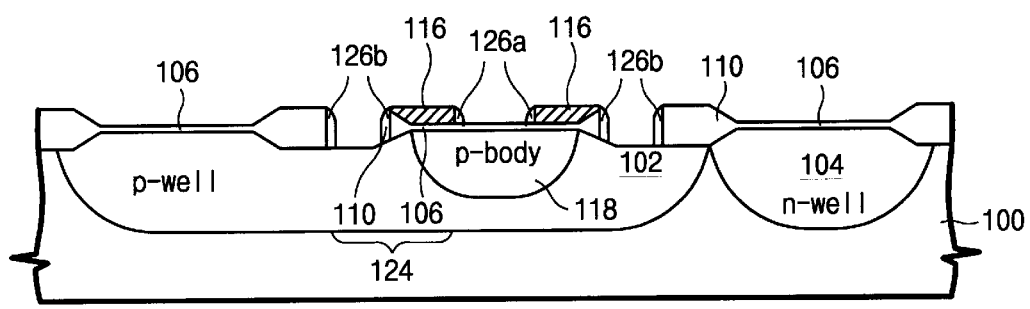

Referring now to FIG. 4G, electrically insulating nitride spacers 126a and 126b may then be formed on sidewalls of the first and second gate electrodes 116 and on sidewalls of those portions of the field oxide isolation regions 110 which are exposed by the drain contact openings 122. The first nitride spacers 126a are formed to electrically insulate sidewalls of the gate electrodes 116 from subsequently formed regions (e.g., source contact) and define placement of a source region relative to first ends of the gate electrodes 116. The second nitride spacers 126b are also formed to electrically insulate sidewalls of the gate electrodes 116 from subsequently formed regions (e.g., drain contact) and define placement and width of a drain region relative to second ends of the gate electrodes 116. Here, the nitride spacers 126a and 126b may be formed by conformally depositing a layer of nitride and then performing an anisotropic etching step to define the spacers, as will be understood by those skilled in the art.

Figure 4H:
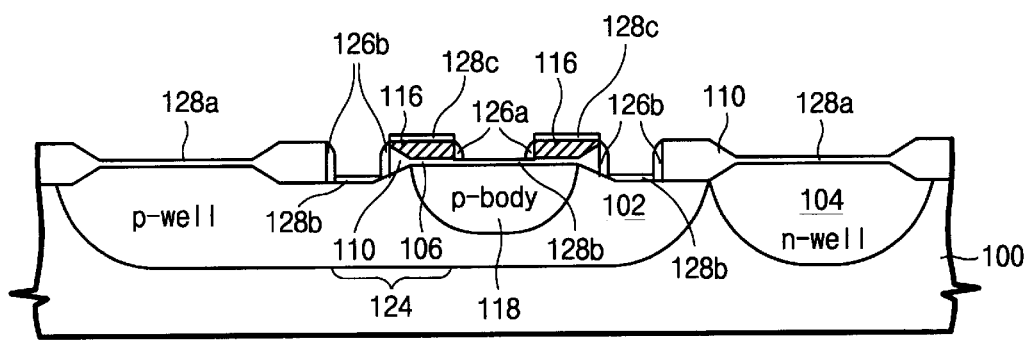
Figure 4I:
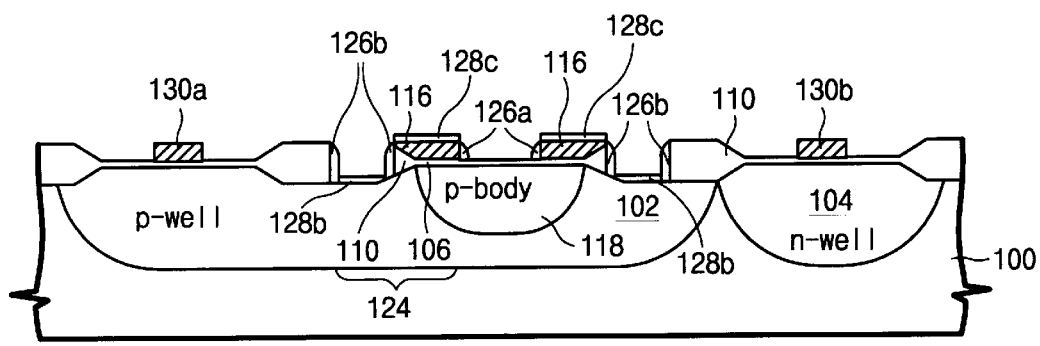
Figure 4J:
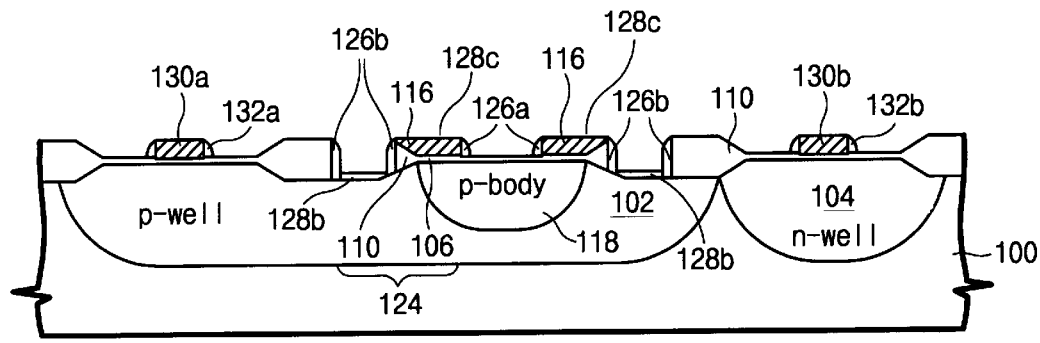

Referring now to FIG. 4H, exposed portions of the first electrically insulating layer 106 are then removed by an etching step to expose the first well region 102, body region 118 and second well region 104. A relatively short duration thermal oxidation step is then performed to define first thermal oxide layers 128a on the first and second well regions 102 and 104, second thermal oxide layers 128b in the source and drain contact openings, and third thermal oxide layers 128c on the first and second gate electrodes 116. Referring now to FIGS. 4I–4J, gate electrodes 130a and 130b of respective NMOS and PMOS transistors are then formed on the first thermal oxide layers 128a, as illustrated. Sidewall spacers 132a and 132b are also formed on sidewalls of the gate electrodes 130a and 130b.

Figure 3:
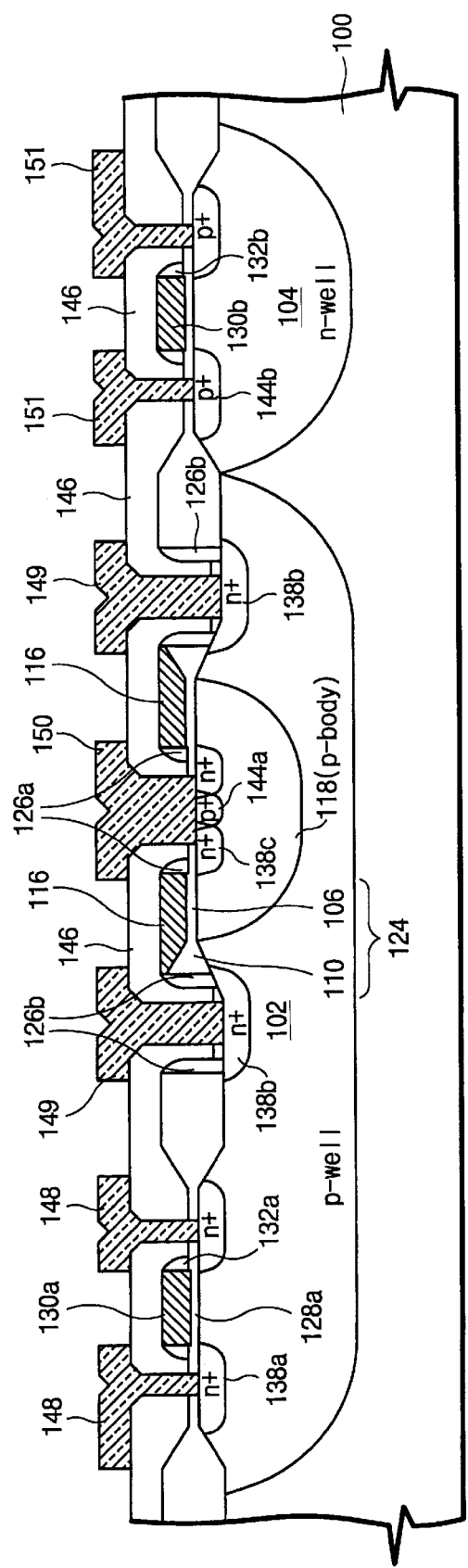
FIG. 3 is a cross-sectional view of semiconductor switching devices according to a first embodiment of the present invention.
Figure 4K:
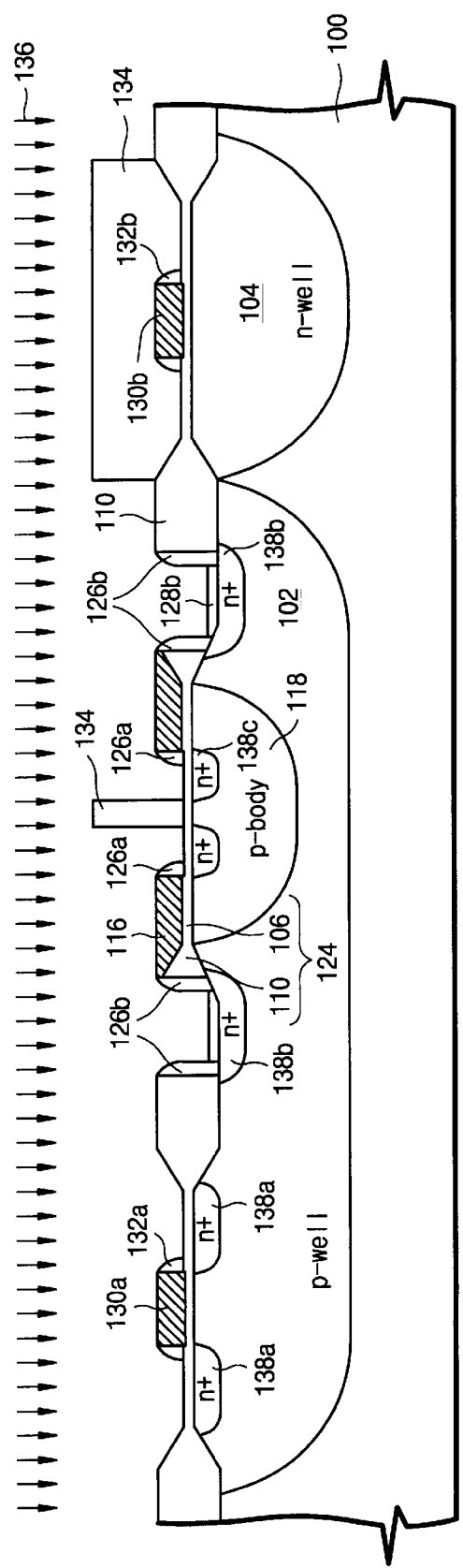
Figure 4L:
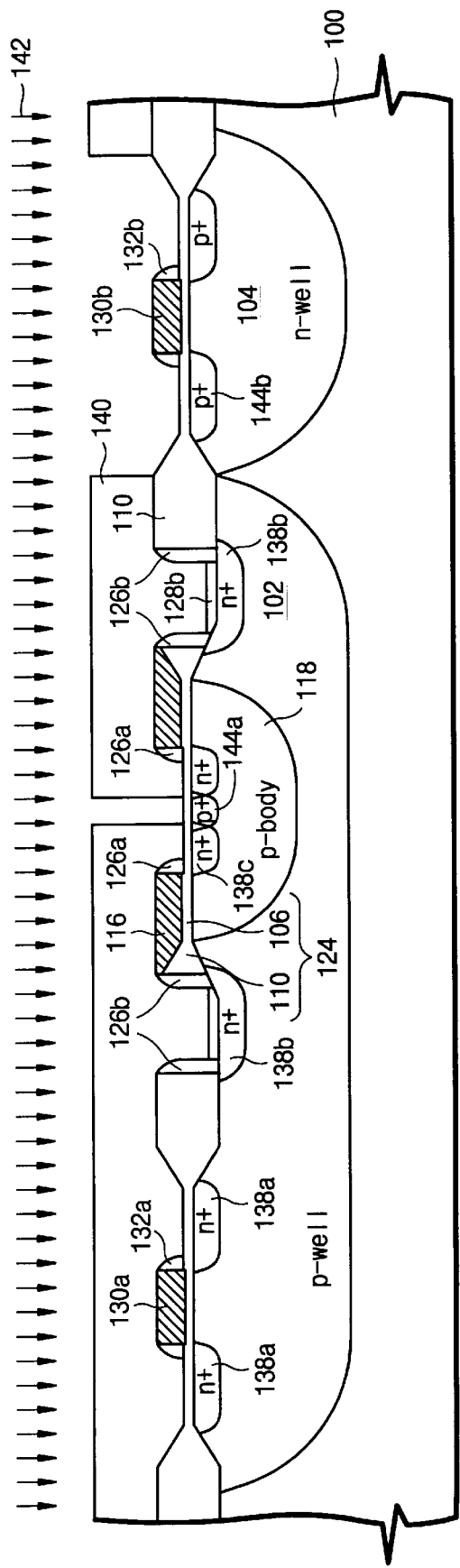
Figure 4M:
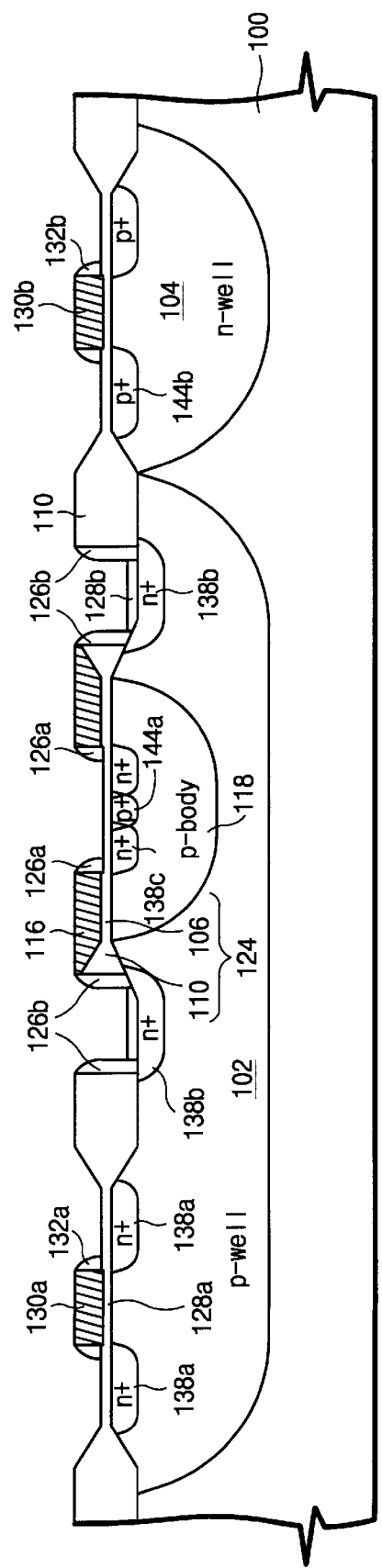

Referring now to FIGS. 4K–4M, a second layer of photoresist 134 is then conformally deposited on the substrate 100 and patterned to define an ion implant mask. Dopants 136 of second conductivity type (e.g., N-type) are then selectively implanted into the first well region 102 to define self-aligned source and drain regions 138a of an NMOS transistor having a respective gate electrode 130a, and define self-aligned source and drain regions 138c and 138b of a lateral n-channel enhancement-mode DMOS transistor having respective gate electrodes 116. Similarly, with respect to FIG. 4L, a third layer of photoresist 140 is then conformally deposited on the substrate 100 and patterned to define an ion implant mask. Dopants 142 of first conductivity type (e.g., P-type) are then selectively implanted into the second well region 104 to define self-aligned source and drain regions 144b of a PMOS transistor having a respective gate electrode 130b and define a highly-doped body contact region 144a (shown as P+) in the body region 118. Then, as illustrated best by FIG. 4M, the third layer of photoresist 140 is removed. Referring now to FIG. 3, an interlayer insulating layer 146 is the formed on the structure of FIG. 4M as a passivation layer. Respective contact holes are then formed in the interlayer insulating layer 146. Conventional metallization steps are then performed to define source and drain electrodes 148 of an NMOS transistor, source and drain electrodes 150 and 149, respectively, of a lateral DMOS transistor, and source and drain electrodes 151 of a PMOS transistor.

Figure 5:
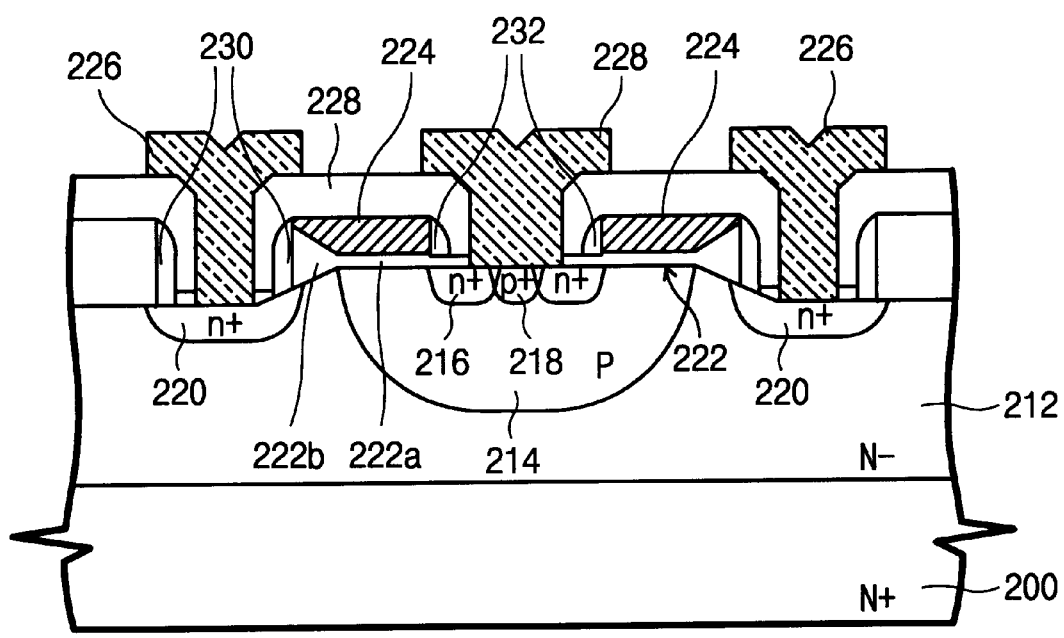
FIG. 5 is a cross-sectional view of semiconductor switching devices according to a second embodiment of the present invention.

Referring now to FIG. 5, a lateral DMOS transistor according to a second embodiment of the present invention is illustrated. According to this embodiment, a relatively highly doped semiconductor substrate 200 (shown as N+) is provided having an epitaxial drift region 212 thereon (shown as N−). A body region 214 is provided in the drift region 212 and first and second source regions 216 (shown as N+) are formed in the body region 214. These first and second source regions 216 may be formed as opposing portions of an annular source region or as distinct stripe-shaped regions which extend in a third dimension (not shown). A central contact region 218 (shown as P+) is also formed in the body region 214. First and second drain regions 220 (shown as N+) are also formed in the drift region 212. These first and second drain regions 220 may be formed as opposing portions of an annular drain region or as distinct stripe-shaped drain regions which extend in a third dimension (not shown). Polysilicon gate electrodes 224 are also provided on respective gate insulating regions 222. Each of these gate insulating regions 222 includes a relatively thick portion 222b adjacent the drain region 220 and a relatively thin portion 222a adjacent the source region 216. These gate insulating regions 222 have tapered thicknesses which increase in a source-to-drain direction and improve the withstand capability of the DMOS transistor by reducing the degree of field crowding at the drain regions 220. These insulating regions 222 also enable the drain regions 220 to be formed closer to the body region 214 to thereby improve on-state resistance. Nitride spacers 232 and 230 are also provided on sidewalls of the gate electrodes 224, as illustrated. In addition, a passivation layer 228 is provided and source and drain contact holes are formed in the passivation layer 228. Drain and source/body contacts 226 and 228 are also provided in ohmic contact with the drain regions 220 and source regions 216, as illustrated.

In the drawings and specification, there have been disclosed typical preferred embodiments of the invention and, although specific terms are employed, they are used in a generic and descriptive sense only and not for purposes of That which is claimed is:

1. A field effect transistor, comprising:
    a semiconductor substrate containing a body region of first conductivity type therein extending to a surface thereof;
    source and drain regions of second conductivity type in said substrate said source and drain regions forming respective P-N junctions with the body region and substrate, respectively;
    a gate electrode on a portion of the surface extending opposite the body region and between said source and drain regions; and
    a gate electrode insulating layer disposed between the gate electrode and the surface, said gate electrode insulating layer having a tapered thickness which increases in a direction from said source region to said drain region; and
    wherein said semiconductor substrate comprises a well region of first conductivity type extending to the surface; wherein the body region is disposed within the well region and forms a non-rectifying junction therewith; and wherein the body region has a lower net first conductivity type dopant concentration therein than the well region.

2. The transistor of claim 1, wherein the body region comprises a portion of the well region which has been compensated by second conductivity type dopants.

3. The transistor of claim 1, wherein said source region is disposed within and forms a P-N junction with the body region; and wherein said drain region is disposed within and forms a P-N junction with the well region.

4. The transistor of claim 3, wherein said gate electrode has a tapered thickness which increases in a direction from said drain region to said source region.

5. A field effect transistor, comprising:
    a semiconductor substrate containing a body region of first conductivity type therein extending to a surface thereof;
    source and drain regions of second conductivity type in said substrate, said source and drain regions forming respective P-N junctions with the body region and substrate, respectively;
    a gate electrode on a portion of the surface extending opposite the body region and between said source and drain regions; and
    a gate electrode insulating layer disposed between the gate electrode and the surface, said gate electrode insulating layer having a tapered thickness which increases in a direction from said source region to said drain region; and
    wherein said gate electrode has a tapered thickness which increases in a direction from said drain region to said source region.

6. A field effect transistor, comprising:
    a semiconductor substrate containing a well region of first conductivity type therein extending to a surface thereof and a body region of first conductivity type within the well region and forming a nonrectifying junction therewith, said body region having a lower net first conductivity type dopant concentration therein than said well region;
    source and drain regions of second conductivity type in said substrate, said source and drain regions forming respective P-N rectifying junctions with said body region and said well region, respectively;
    a gate electrode on a portion of the surface extending opposite the body region and between said source and drain regions; and
    a gate electrode insulating layer disposed between the gate electrode and the surface, said gate electrode insulating layer having a tapered thickness which increases in a direction from said source region to said drain region.

7. A field effect transistor, comprising:
    a semiconductor substrate containing a well region of first conductivity type therein extending to a surface thereof and a body region of first conductivity type within the well region and forming a nonrectifying junction therewith, said body region having a lower net first conductivity type dopant concentration therein than said well region;
    source and drain regions of second conductivity type in said substrate, said source and drain regions forming respective P-N rectifying junctions with said body region and said well region, respectively;
    gate electrode on a portion of the surface extending opposite the body region and between said source and drain regions; and
    a gate electrode insulating layer disposed between the gate electrode and the surface, said gate electrode insulating layer having a tapered thickness which increases in a direction from said source region to said drain region; and
    wherein said gate electrode has a tapered thickness which increases in a direction from said drain region to said source region.

8. A field effect transistor, comprising:
    a semiconductor substrate containing a body region of first conductivity type therein extending to a surface thereof;
    a gate electrode on a portion of the surface extending opposite the body region;
    source and drain regions of second conductivity type in said substrate and self aligned to opposing ends of said gate electrode; and
    a gate electrode insulating layer disposed between the gate electrode and the surface, said gate electrode insulating layer having a tapered thickness which increases in a direction from said source region to said drain region;
    wherein said semiconductor substrate comprises a well region of first conductivity type extending to the surface; wherein the body region is disposed within the well region and forms a non-rectifying junction therewith; wherein the body region has a lower net first conductivity type dopant concentration therein than the well region; wherein said source region is formed within the body region and forms a P-N junction therewith; and wherein said drain region is formed outside the body region but within the well region and forms a P-N junction with the well region.

9. A method of forming a field effect transistor, comprising the steps of:
    forming a semiconductor substrate having a surface thereon;
    forming a gate electrode insulating layer having a tapered thickness which increases from a first thickness at a first end to a second thickness at a second end, on the surface;

forming a gate electrode on the first and second ends of the gate electrode insulating layer; and forming source and drain regions of second conductivity type in the semiconductor substrate, adjacent and self aligned to the first and second ends of the gate electrode, respectively; and wherein said steps of forming a gate electrode and gate electrode insulating layer comprise the steps of:
   forming a first electrically insulating layer on the surface;
   forming a gate electrode having first and second ends, on the first electrically insulating layer; and
   increasing a thickness of a portion of the first electrically insulating layer extending between the second end of the gate electrode and the surface by oxidizing a portion of the surface extending opposite the second end of the gate electrode.

10. The method of claim 8, wherein the gate electrode comprises polycrystalline silicon; and wherein said step of increasing a thickness of a portion of the first electrically insulating layer comprises oxidizing a second end of the gate electrode so that the first end of the gate electrode is thicker than the second end of the gate electrode.

11. The method of claim 9, wherein said step of oxidizing a portion of the surface extending opposite the second end of the gate electrode comprises oxidizing a portion of the surface extending opposite the second end of the gate electrode to define a field oxide isolation region adjacent the second end of the gate electrode; and wherein said step of forming source and drain region comprises the steps of etching the field oxide isolation region to define a drain contact opening therein and then implanting dopants of second conductivity type through the drain contact opening and into the surface to define a drain region in the semiconductor substrate.

12. A method of forming a field effect transistor, comprising the steps of:
   forming a semiconductor substrate having a surface thereon;
   forming a first electrically insulating layer on the surface;
   forming a gate conductive layer having opposing ends, on the first electrically insulating layer;
   oxidizing first and second portions of the substrate extending adjacent the opposing ends of the gate conductive layer to define first and second field oxide isolation regions having respective first and second bird's beak oxide extensions which extend opposite the ends of the gate conductive layer and merge with the first electrically insulating layer;
   patterning the gate conductive layer to define a gate electrode having a first end and a second opposing end which extends opposite the second bird's beak oxide extension; and
   forming source and drain regions in the substrate, adjacent and self-aligned to the first and second ends of the gate electrode, respectively.

13. A method of forming a semiconductor switching device, comprising the steps of:
   forming a semiconductor substrate containing a well region of first conductivity type therein extending to a surface thereof;
   implanting dopants of second conductivity type into the well region;
   diffusing the implanted dopants of second conductivity type to define a body region that extends to the surface and has a lower net first conductivity type dopant concentration therein than the well region;
   forming source and drain regions of second conductivity type in said substrate;
   forming a gate electrode on a portion of the surface extending opposite the body region and between said source and drain regions, said gate electrode having a tapered thickness which increases in a direction from said drain region to said source region; and
   forming a gate electrode insulating layer disposed between the gate electrode and the surface, said gate electrode insulating layer having a tapered thickness which increases in a direction from said source region to said drain region.

* * * * *

UNITED STATES PATENT AND TRADEMARK OFFICE
CERTIFICATE OF CORRECTION

PATENT NO. : 6,046,474
DATED : April 4, 2000
INVENTOR(S) : Oh et al.

It is certified that error appears in the above-identified patent and that said Letters Patent is hereby corrected as shown below:

In the Claims:
Column 9, line 18, please delete "8" and substitute -- 9 -- therefor.

Signed and Sealed this

Sixth Day of March, 2001

Attest:

NICHOLAS P. GODICI

Attesting Officer     Acting Director of the United States Patent and Trademark Office